(12) United States Patent
Berggren et al.

(10) Patent No.: US 11,523,512 B2
(45) Date of Patent: Dec. 6, 2022

(54) METHOD FOR MOUNTING ELECTROACOUSTIC COMPONENT ON PCB AND ELECTROACOUSTIC COMPONENT STRUCTURE

(71) Applicant: ARIOSE ELECTRONICS CO., LTD., Taoyuan (TW)

(72) Inventors: Magnus Berggren, Huskvarna (SE); Anders Nordlander, Hargshamn (SE); Yaotsun Lu, Taoyuan (TW)

(73) Assignee: ARIOSE ELECTRONICS CO., LTD., Taoyuan (TW)

( * ) Notice: Subject to any disclaimer, the term of this patent is extended or adjusted under 35 U.S.C. 154(b) by 6 days.

(21) Appl. No.: 17/075,267

(22) Filed: Oct. 20, 2020

(65) Prior Publication Data
US 2021/0127492 A1  Apr. 29, 2021

(30) Foreign Application Priority Data
Oct. 23, 2019 (TW) ................................. 108138237

(51) Int. Cl.
*H05K 1/11* (2006.01)
*H05K 1/18* (2006.01)
*H05K 3/30* (2006.01)

(52) U.S. Cl.
CPC ............. *H05K 1/181* (2013.01); *H05K 3/301* (2013.01); *H05K 2201/10083* (2013.01)

(58) Field of Classification Search
CPC ....................................................... H05K 1/181

USPC .......................................................... 361/760
See application file for complete search history.

(56) References Cited

U.S. PATENT DOCUMENTS

| 5,475,317 | A  | * | 12/1995 | Smith ................... | G01R 1/0483 |
|---|---|---|---|---|---|
|  |  |  |  |  | 324/750.05 |
| 5,528,463 | A  | * | 6/1996 | McLellan .............. | G04G 17/02 |
|  |  |  |  |  | 257/690 |
| 11,324,122 | B2 | * | 5/2022 | Moitzi ..................... | H05K 3/44 |
| 2004/0250959 | A1 | * | 12/2004 | Mok .................. | H05K 13/0409 |
|  |  |  |  |  | 156/556 |
| 2013/0207807 | A1 | * | 8/2013 | Popper ..................... | G01J 1/58 |
|  |  |  |  |  | 340/600 |

(Continued)

*Primary Examiner* — Stanley Tso
(74) *Attorney, Agent, or Firm* — Chun-Ming Shih; HDLS IPR Services

(57) ABSTRACT

This invention provides a method for mounting an electroacoustic component on a PCB and an electroacoustic component structure, so as to improve the problem that the traditional electroacoustic component affects the electrical characteristics due to the high temperature baking action in a reflow oven. The method comprises a step of separating and constructing a housing of the electroacoustic component. The housing comprises a shell seat and a base seat, the shell seat is provided with a plurality of sound producing components, and the base seat is provided with at least two conducting terminals for adhering the base seat to the PCB. The conducting terminals on the base seat and the at least two contacts on the PCB are adhered to each other and electrically connected in the reflow oven, and then the shell seat and the base seat are combined to make the shell seat and the base seat with the PCB combined outside the reflow oven into a single body to form an electroacoustic component that is mounted on the PCB.

2 Claims, 6 Drawing Sheets

(56) References Cited

U.S. PATENT DOCUMENTS

| | | | |
|---|---|---|---|
| 2015/0091600 A1* | 4/2015 | Rathburn | G01R 1/0466 324/756.02 |
| 2019/0150311 A1* | 5/2019 | Mason | H01R 12/82 439/55 |
| 2021/0278612 A1* | 9/2021 | Sundaram | G02B 6/4204 |

* cited by examiner

METHOD FOR MOUNTING ELECTROACOUSTIC COMPONENT ON PCB AND ELECTROACOUSTIC COMPONENT STRUCTURE

BACKGROUND OF THE INVENTION

1. Field of the Invention

The present invention relates to the structure and mounting technology of an electroacoustic component, and more particularly to a method and electroacoustic component structure suitable for mounting an electroacoustic component on a PCB.

2. Description of Related Art

Generally speaking, an electroacoustic component includes a piezoelectric buzzer, a magnetic buzzer, a dynamic speaker, and the like. Among them, the piezoelectric buzzer uses the piezoelectric effect of the piezoelectric ceramic to drive the vibration of the diaphragm to generate sound, and the magnetic buzzer uses the electromagnetic to energize and de-energize the metal diaphragm to generate vibration and then sound. However, the dynamic speaker uses the magnetic field effect generated by the coil energization to drive the diaphragm to vibrate and sound. Therefore, the electroacoustic components are generally assembled on the PCB and sounded by the driving of the conductive loop provided by the circuit layer of the PCB.

It is known that when we assemble electronic components, such as ICs and electroacoustic components, on the PCB, it generally depends on surface mounting technology (SMT), which is printed with solder paste on the surface of the circuit layer of the PCB, and then adsorbed by, for example, a suction cup on a robot. The electronic component is plugged into the PCB, and then the electronic component and the solder paste which have been plugged on the surface of the PCB are welded by a reflow oven (for example, IR oven), so that the electronic component can be firmly adhered to the circuit of the PCB. The surface of the layer is used to turn on the conductive loop of each of the electronic components on the PCB.

The electroacoustic components of the above electronic components are generally composed of the sound producing components assembled in a housing. The electroacoustic component is exemplified by a piezoelectric buzzer, the sound producing components that are assembled in a housing thereof includes a piezoelectric ceramic element, a diaphragm, a circuit board and conducting terminals, etc., these sound producing components must be subjected to a high temperature baking of about 245° C. in the reflow oven during the fusion welding process of the above reflow oven. In this high temperature environment, in addition to test the characteristics of enduring temperature of the housing material, it also affects the electrical characteristics of, for example, the piezoelectric buzzers, diaphragms, the circuit boards, and the like.

Faced with this problem, today's operators can only utilize materials that can withstand high temperature of the above reflow oven to make for the housing and sound producing components of the electroacoustic component, but thus increase the cost of producing the electroacoustic component. It needs to be improved.

SUMMARY OF THE INVENTION

An object of the present invention is to minimize the effects upon high temperature baking of the reflow oven on the housing of the electroacoustic component and the sound producing components assembled, so as to maintain the electrical characteristics of these components.

In order to achieve the above-mentioned object, a preferred embodiment of the present invention is directed to a method for mounting an electroacoustic component on a PCB comprising the steps of:

(S1) separating and constructing a housing of the electroacoustic component, the housing comprising a shell seat and a base seat which are separated and then combined into a single body, and the shell seat being pre-installed to comprise a plurality of sound producing components, and the base seat being pre-installed and comprising at least two conducting terminals;

(S2) adhering the base seat to the PCB, so that the at least two conducting terminals on the base seat and at least two contacts on the PCB being adhered to each other and being electrically connected in a reflow oven;

(S3) combining the shell seat and the base seat, so that the shell seat being combined with the base seat adhered to the PCB into the single body outside the reflow oven, and the at least two conducting terminals being electrically connected to the plurality of at least one of the sound producing components to be configured to be attached to the electroacoustic component on the PCB.

According to the present invention, the electroacoustic component is preferably one of a piezoelectric buzzer, an magnetic buzzer, and a dynamic speaker, and one of the plurality of sound producing components is a circuit board.

According to the present invention, the base seat preferably is made of a heat-resistant plastic, and the shell seat and the sound producing component are excluded from utilizing the heat-resistant plastic.

In order to specifically implement the above-mentioned method, the present invention further provides an electroacoustic component structure suitable for mounting on the PCB comprising:

a shell seat having a chamber formed therein, and a plurality of sound producing components being installed in the chamber; and a base seat mounted with at least two conducting terminals, the base seat being applied in a reflow oven so that the at least two conducting terminals and at least two contacts on the PCB being adhered to each other in the reflow oven in order to be electrically connected;

wherein one end of the shell seat is formed with a connecting part, one end of the base seat forms a pair of docking sections for coupling the connecting part, and the shell seat and the base seat can be combined with each other external to the reflow oven, by means of the combination of the connecting part and the docking sections such that the at least two conducting terminals are electrically connected to at least one of the plurality of sound producing components.

In a further implementation of the present invention, the shell seat preferably comprises a seat body and a set of seat cover disposed on the seat body, the chamber is formed in the seat body.

In a further implementation of the present invention, the at least two conducting terminals are respectively bent to form a J-shaped body exposed on two opposite end surfaces of the base seat, so as to electrically connect at least one of the contacts on the PCB and the plurality of sound producing components.

In the implementation of the above method and structure of the present invention, the electroacoustic component may be one of a piezoelectric buzzer, an magnetic buzzer, and a dynamic speaker. In addition, just the base seat is made of a heat-resistant plastic, and the shell seat and the sound producing component can be excluded from utilizing the heat-resistant plastic.

According to the above technical means, the overall improvement of the present invention is to maintain the electrical characteristics of the electroacoustic component that has been adhered to the PCB, comprising the electrical characteristics of the piezoelectric buzzer, the diaphragm, circuit board, etc. in the electroacoustic component. In addition, the present invention can also eliminate the utilization of high temperature resistant material to fabricate the shell seat of the electroacoustic components (including the seat body and the seat cover), the piezoelectric buzzer, the diaphragm, circuit boards, etc., thus reducing the cost of producing electro-acoustic components.

The specific implementation details of the above technical means and their production performance of the present invention will be described with reference to the following embodiments and drawings.

DETAILED DESCRIPTION OF THE PREFERRED EMBODIMENT

Figure 1:
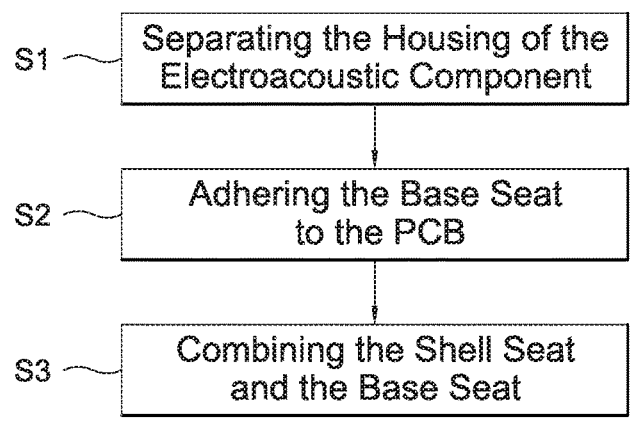
FIG. 1 is a flowchart showing the steps of the mounting method of the present invention.
Figure 2A:
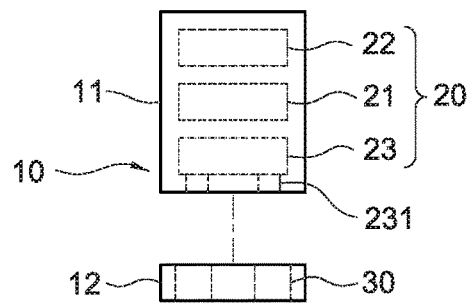
FIGS. 2a to 2e are schematic views respectively showing the operation of the mounting method of FIG. 1.

First, referring to FIG. 1, a method for mounting an electroacoustic component on a PCB according to the present invention comprises the following steps S1 to S3 being performed in sequence:

Step S1: separating the housing of the electroacoustic component;

Please refer to FIG. 2a, which illustrates a pre-construction of the housing 10 of the electroacoustic component by means of a plastic injection molding technique, which can be independently integrated and then combined and integrated into a shell seat 11 and a base seat 12. The shell seat 11 is pre-installed with a plurality of sound producing components 20 having electrical characteristics susceptible to high temperature, the plurality of sound producing components 20 including at least one circuit board 23, and the base seat 12 is pre-mounted to comprise at least two conducting terminals 30. The base seat 12 is made of a heat-resistant plastic, and the shell seat 11 and the sound producing component 20 are excluding the utilization of the heat-resistant plastic. The heat-resistant plastic refers to a plastic that can withstand high temperature baking at a reflow oven of about 245° C.

Figure 2B:
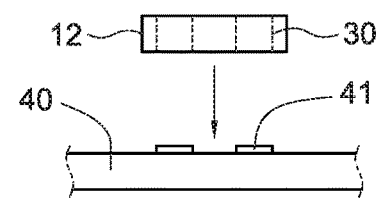
Figure 2C:
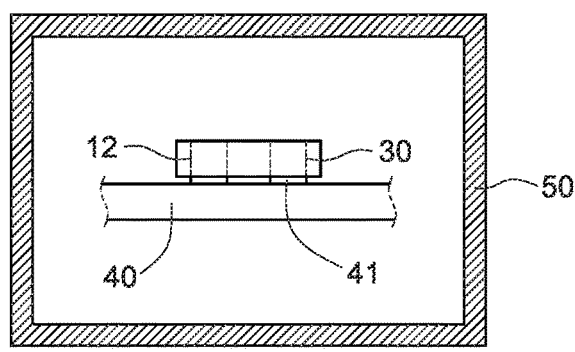

Step S2: adhering the base seat to the PCB;

Please refer to FIG. 2b and FIG. 2c in sequence to illustrate that the solder paste is printed on the contacts 41 of the PCB 40, and then the base seat 12 is captured by the robot, for example, and placed on the PCB 40 (as shown in FIG. 2b). The conducting terminals 30 on the base seat 12 are brought into contact with the contacts 41 on the PCB 40, and then the PCB 40 is moved into a reflow oven 50 (as shown in FIG. 2c) by means of a reflow oven 50. The high temperature baking at 245° C. causes the solder paste to melt, so that the conducting terminals 30 on the base seat 12 and the contacts 41 on the PCB 40 can be adhered to each other and electrically connected.

Figure 2D:
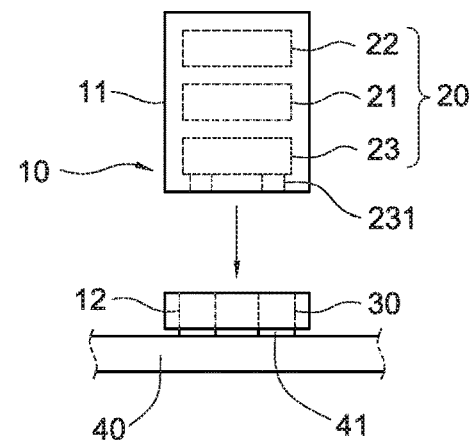
Figure 2E:
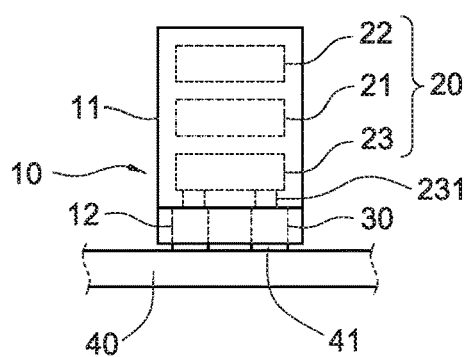

Step S3: combining the shell seat and the base seat;

Please refer to FIG. 2d and FIG. 2e in order to remove the PCB 40 with the base seat 12 adhered from the reflow oven 50, so that the PCB 40 with the base seat 12 adhered away from the high temperature in the reflow oven 50. The shell seat 11 can be picked up by, for example, a robot in a normal temperature or room temperature environment, and the shell seat 11 can be buckled or screwed onto the base seat 12 that has been adhered to the PCB 40 (as shown in FIG. 2d). When the shell seat 11 and the base seat 12 are integrated, the conducting terminals 30 on the base seat 12 can be electrically connected to at least two circuit terminals 231 on the circuit board 23 in the shell seat 11 to form an electrical connection. An integral electroacoustic component is bonded to the PCB 40 (as shown in FIG. 2e). In this way, the plurality of sound producing components 20 installed in the shell seat 11 and the shell seat 11 can be prevented from being subjected to high temperature in the reflow oven 50.

In order to specifically implement the above method, referring to FIG. 3 to FIG. 6, the first structural embodiment of the piezoelectric buzzer as the electroacoustic component of the present invention is disclosed, and the piezoelectric buzzer is illustrated. The structure of the piezoelectric buzzer comprises the above-mentioned shell seat 11, the base seat 12 and the plurality of sound producing components 20. In which:

A chamber 111 for mounting the plurality of sound producing components 20 is formed in the shell seat 11, and a connecting part 113 is formed on a wall of the housing at one end of the shell seat 11. In the present embodiment, the sound producing component 20 comprises a buzzer piece 21 made by piezoelectric ceramics, a diaphragm 22, a circuit board 23, and the like, and the diaphragm 22 is made to reciprocally vibrate and of conical basin shape. The circumferential surface of the diaphragm 22 is fixed to the wall surface of the chamber 111, and the central pelvic region of the buzzer piece 21 is attached to the diaphragm 22, and the buzzer piece 21 electrically connected to the circuit board 23 is further externally connected to the power supply end so as to utilize the piezoelectric effect of the buzzer piece 21 to drive the diaphragm 22 to vibrate and sound.

In order to facilitate the convenience of assembling the sound producing component 20 in the shell seat 11, the shell seat 11 can be implemented to comprise a seat body 11a and a set of seat covers 11b disposed on the seat body 11a. The chamber 111 is formed in the seat body 11a, and the chamber 111 has a fixing plate 115 therein. The fixing plate 115 may be fixed in the seat body 11a by press fitting, or may be integrally formed by the wall surface of the chamber 111 of the seat body 11a. The circuit board 23 is fixed by the fixing plate 115 in the chamber 111. The two ends of the seat body 11a are respectively formed with a first opening 112 and a second opening 116. The connecting part 113 may be a single or a plurality and is formed in a ring form or a spaced-apart form on the seat body 11a around the first opening 112. The second opening 116 of the seat body 11a communicates with the chamber 111, and the seat cover 11b is, for example, a press buckle disposed on the second opening 116. The diaphragm 22 is disposed between the seat body 11a and the seat cover 11b and is located in the chamber 111. The seat cover 11b is formed with at least one sound hole 114. The sound emitted from the vibration of the buzzer piece 21 is transmitted to the outside through the sound hole 114.

Further, the base seat 12 is formed in a disk shape capable of covering one end portion of the shell seat 11, and one end surface of the base seat 12 is formed with a docking section 121 for coupling the connecting part 113. The connecting part 113 and the docking section 121 can be implemented as a combination of a card rib having a male and female locking ability and a wedge slot relative to the wedge ring, or a combination form in which the screw is relatively locked.

Figure 3:
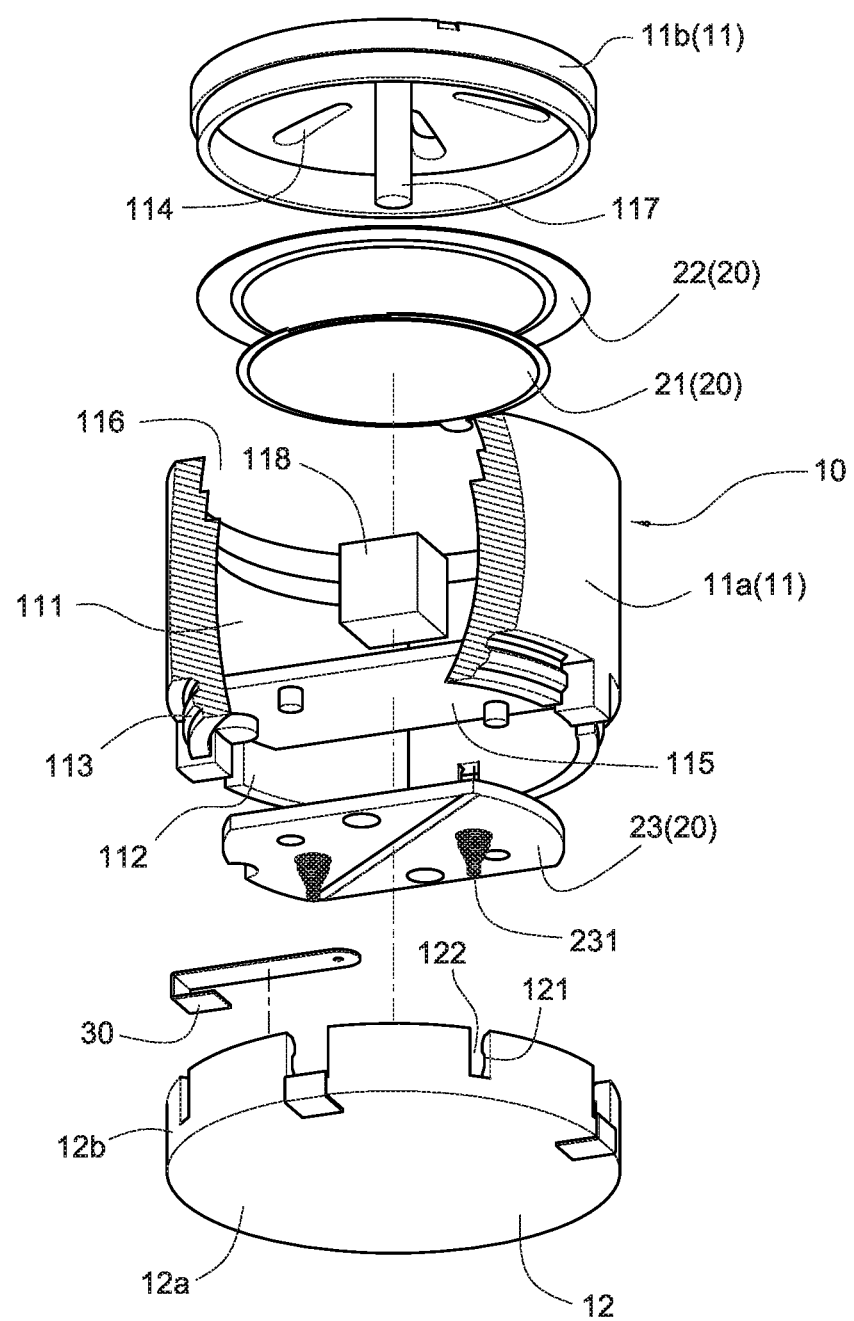
FIG. 3 is an exploded perspective view showing the first embodiment of the present invention illustrating a piezoelectric buzzer as an embodiment of the electroacoustic component.
Figure 4:
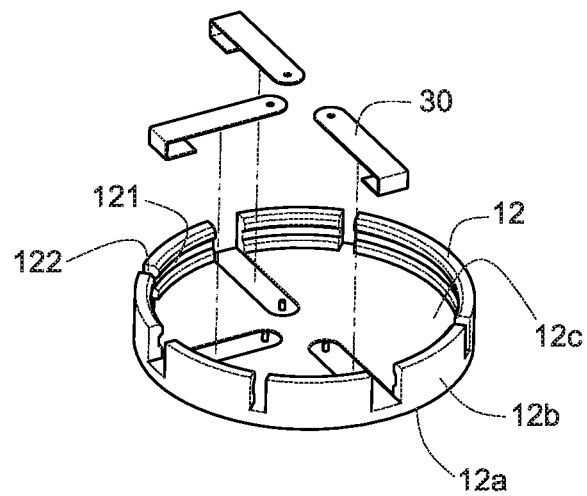
FIG. 4 is an exploded perspective view of another perspective of the base seat of FIG. 3 of the present invention.
Figure 5:
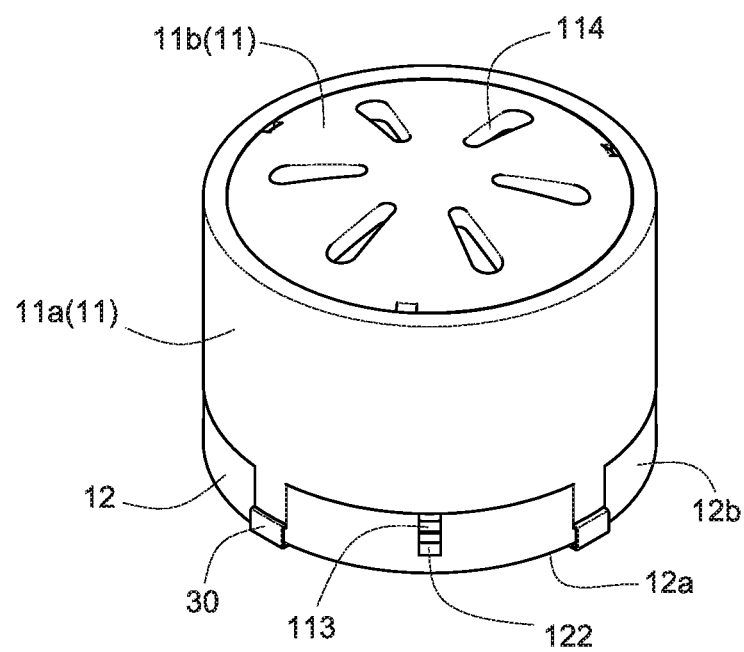
FIG. 5 is a perspective view of the components of FIG. 3 assembled of the present invention.
Figure 6:
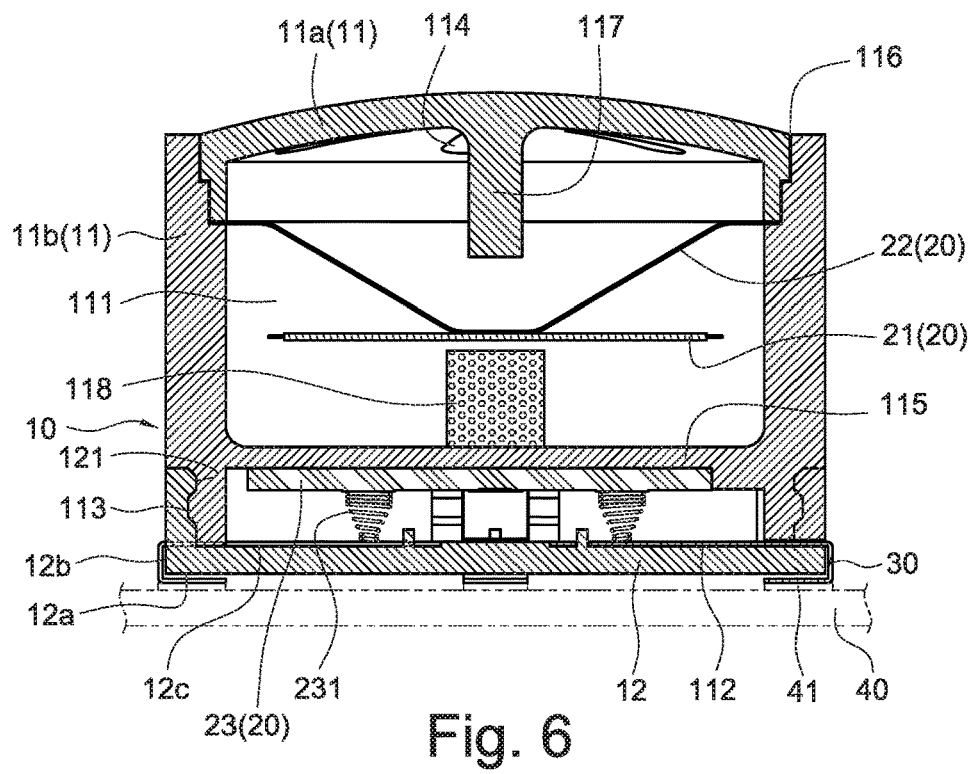
FIG. 6 is an enlarged cross-sectional view of FIG. 5 of the present invention.

When the connecting part 113 and the docking section 121 are implemented in the form of the male and female wedge ring and the wedge slot shown in FIG. 3 to FIG. 5, the robot for picking up the shell seat 11 only needs to perform the press action of position-to-bit. When the positional pressing action is performed, the shell seat 11 can be press-bonded to the base seat 12 of the PCB 40. When the connecting part 113 and the docking section 121 are formed into a screw-locking combination (common screwing, the technical application is not shown). The robot for picking up the shell seat 11 just performs the aligned rotation operation, so as to bond the shell seat 11 to the base seat 12 of the PCB 40. In the current control technology of the robot, the above two combinations can enable the shell seat 11 to accurately align the positive and negative electrodes with the conducting terminals 30 and the circuit terminals 231 when the base seat 12 is coupled for stably electrical connection.

Further, at least one notch 122 is further formed on the docking section 121. When the shell seat 11 and the base seat 12 are integrated, the connecting part 113 can be pushed by the tool through the notch 122, so that the connecting part 113 and the docking section 121 are no longer maintained in a coupled state, thereby enabling the shell seat 11 to be separated from the base seat 12.

Further, the base seat 12 is provided with the two conducting terminals 30, and the two conducting terminals 30 can be bent and made from a metal piece to form a J-shaped body, so that the conducting terminals 30 can be sequentially arranged from the outer end surface 12a and the end wall 12b of the base seat 12 and are extended to the inner end surface 12c of the base seat 12 to be fixedly fastened to the base seat 12, so that the double ends of the conducting terminals 30 can be respectively exposed on the opposite sides of the base seat 12. The end faces (the outer end surface 12a and the inner end surface 12c) are disposed so that the double ends of the conducting terminals 30 can be electrically connected to the circuit terminals 231 of the circuit board 23 and the contacts 41 on the PCB 40, respectively. Accordingly, when the PCB 40 is energized, an excitation voltage can be output to the buzzer piece 21 via the circuit board 23 in the piezoelectric buzzer (i.e., the electroacoustic component) so as to be attached to the flexible diaphragm 22. The buzzer piece 21 located at the basin area of the flexible diaphragm 22 generates a vibration frequency, which in turn makes a sound.

The two circuit terminals 231 on the circuit board 23 may be made of an elastic element such as a spiral compression spring, and the two circuit terminals 231 have positive and negative electrodes. When the shell seat 11 and the base seat 12 are integrated, the two circuit terminals 231 can be in close contact with the two conducting terminals 30 on the base seat 12 according to the requirements of the positive and negative conductive paths thereof to maintain the electrical connection of two elements.

Please refer to FIG. 3 and FIG. 6 again. The seat cover 11b is formed with a limiting post 117 extending from the seat cover 11b into the seat body 11a (that is, in the chamber 111). To limit the amplitude of the diaphragm 22, a fixing sponge 115 is fixed on the fixing plate 115, and the sponge 118 can be regarded as an accessory of the sound producing component 20, and is disposed in the shell seat 11 along with the sound producing component 20, thereby avoiding the high temperature interference of the reflow oven. The buzzer piece 21 is located between the limiting post 117 and the sponge 118. Thereby, the buzzer piece 21 can maintain the stable vibration frequency by the restraint of the sponge 118 and the limiting post 117 when vibrating.

Figure 7:
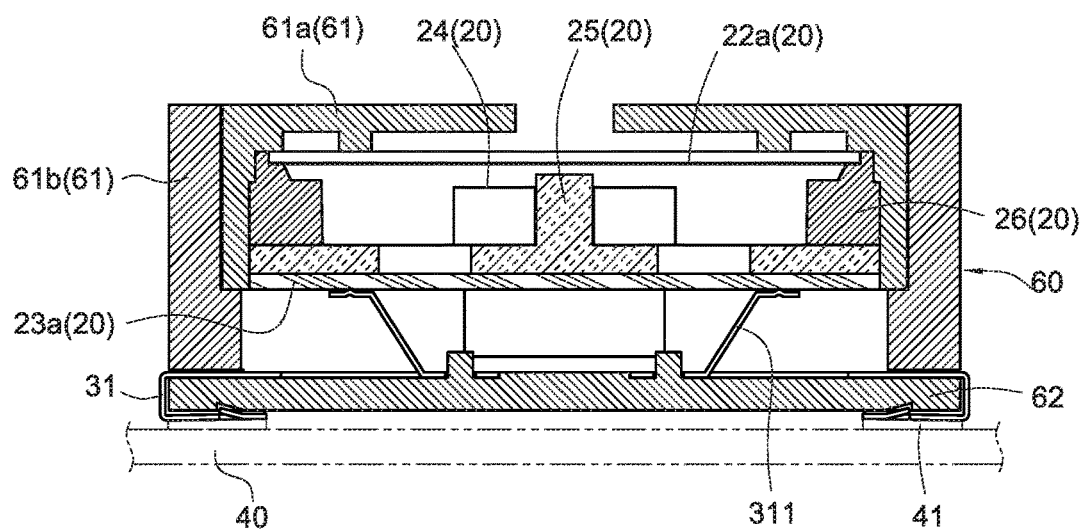
FIG. 7 is a cross-sectional view showing a second embodiment of the present invention illustrating an embodiment in which a magnetic buzzer is used as an electroacoustic component.

Please refer to FIG. 7, which illustrates a second structural embodiment of the present invention using a magnetic buzzer as an electroacoustic component, illustrating the structure of the magnetic buzzer and the first piezoelectric buzzer described above. The biggest difference between the devices is that the plurality of sound producing components 20 installed in the shell seat 61 of the housing 60 are replaced by the well-known circuit board 23a, connecting coils 24, the corresponding magnetic poles 25, the magnets 26 and the diaphragm 22a, etc. The two circuit terminals 311 are replaced and made of elastic elements of the non-helical compression spring. In more details, the two circuit terminals 311 are made by bending the conducting terminals 30 on the base seat 62 to form a tilted arm lifted configuration. Therefore, when the shell seat 61 and the base seat 62 are integrated, the two circuit terminals 311 can be electrically connected to the positive and negative contacts on the circuit board 23a according to their positive and negative electrical polarity. In addition, the internal structure of the shell seat 61 is formed by combining the seat body 61a and the seat cover 61b and is matched to install the sound producing component 20 described above, so that the magnetic buzzer can utilize the coil 24 during turning on and turning off and is activated to vibrate by the action between the magnetic pole 25 and the magnet 26 to drive the diaphragm 22a to generate sound. In addition, the rest of the structure and the mounting method of the embodiment are substantially the same as those of the first embodiment. In particular, the present embodiment fully applies the above method of the present invention to perform the step of mounting the electroacoustic component on the PCB.

Figure 8:
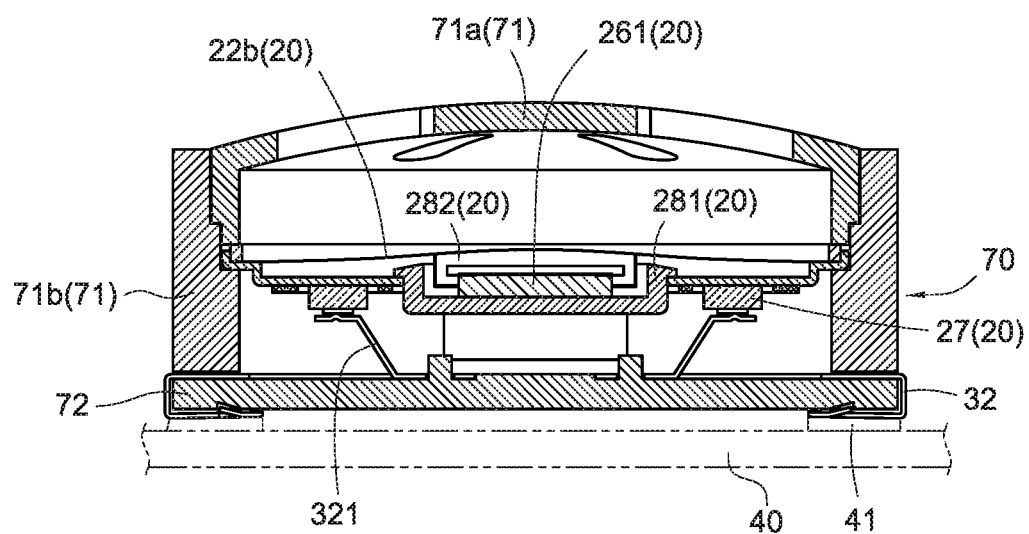
FIG. 8 is a cross-sectional view showing the embodiment of the third embodiment of the present invention illustrating an embodiment in which a dynamic speaker is used as an electroacoustic component.

Please refer to FIG. 8 to illustrate a third structural embodiment of the present invention using a dynamic speaker as an electroacoustic component. The biggest difference between the structure of the dynamic speaker and the first embodiment piezoelectric buzzer described above is that the plurality of sound producing components 20 mounted in the shell seat 71 of the housing 70 are electrically connected and replaced by the well-known printed circuit electrode 27, the yoke 281, and the voice coil 282, and correspondingly assembled magnet 261, the diaphragm 22b, and the like. The printed circuit electrode 27 is used to replace the circuit board of the first and second embodiments, and the two circuit terminals 321 are made by bending the conducting terminals 32 on the base seat 72 to form a tilted arm tilting shape for facilitating the electrical connection between the two circuit terminals 321 and the printed circuit electrode 27 when the shell seat 71 is integrated with the base seat 72. In addition, the internal structure of the shell seat 71 formed by combining the seat body 71a and the seat cover 71b is matched to mount the sound producing component 20 described above, so that the dynamic speaker can excite the yoke 281 by using the printed circuit electrode 27 and the voice coil 282 generates a magnetic field effect to activate the diaphragm 22b to vibrate. In addition, the rest of the structure and the mounting method of this embodiment are substantially the same as those of the first embodiment. In particular, the present embodiment is fully applicable to the above-described method of the present invention to perform the steps of mounting an electroacoustic component on the PCB.

The above embodiments are merely illustrative of preferred embodiments of the invention, but are not to be construed as limiting the scope of the invention. It should be noted that various modifications and improvements may be made without departing from the spirit and scope of the invention. Therefore, the present invention should be based on the content of the claims defined in the scope of the patent application.

We claim:

1. A method for mounting an electroacoustic component on a PCB comprising the steps of:
   (S1) separately constructing a housing of the electroacoustic component,
   the housing comprising a shell seat and a base seat which are separate and then combined into a single body,
   and the shell seat being pre-installed to comprise a plurality of sound producing components,
   and the base seat being pre-installed and comprising at least two conducting terminals,
   wherein the plurality of sound producing components are fully disposed inside the shell seat,
   the base seat is made of a heat-resistant plastic,
   and the shell seat and the sound producing component are excluded from utilizing the heat-resistant plastic,
   one end of the shell seat is formed with a connecting part, and one end of the base seat forms a pair of docking sections for coupling the connecting part;
   (S2) adhering the base seat to the PCB, so that the at least two conducting terminals on the base seat and at least two contacts on the PCB being adhered to each other and being electrically connected in a reflow oven; and
   (S3) combining the shell seat and the base seat, so that the shell seat being combined with the base seat adhered to the PCB into a single body outside the reflow oven, and the at least two conducting terminals being electrically connected to the plurality of at least one of the sound producing components to be configured to be attached to the electroacoustic component on the PCB.

2. The method of claim 1, wherein the electroacoustic component is one of a piezoelectric buzzer, a magnetic buzzer, and a dynamic speaker, and one of the plurality of sound producing components is a circuit board.

* * * * *